United States Patent [19]
Arioka et al.

[11] Patent Number: 5,524,226
[45] Date of Patent: Jun. 4, 1996

[54] REGISTER FILE SYSTEM FOR MICROCOMPUTER INCLUDING A DECODING SYSTEM FOR CONCURRENTLY ACTIVATING SOURCE AND DESTINATION WORD LINES

[75] Inventors: Masaaki Arioka; Shigeo Mizugaki, both of Hyogo-ken, Japan

[73] Assignee: Mitsubishi Denki Kabushiki Kaisha, Tokyo, Japan

[21] Appl. No.: 434,605

[22] Filed: May 3, 1995

Related U.S. Application Data

[63] Continuation of Ser. No. 964,221, Oct. 21, 1992, abandoned.

[30] Foreign Application Priority Data

Oct. 22, 1991 [JP] Japan ................... 3-302334

[51] Int. Cl.⁶ .................................. G06F 12/02
[52] U.S. Cl. .................. 395/405; 364/DIG. 1; 364/260.2; 364/942.8; 364/254.3; 365/230.06; 395/492
[58] Field of Search .................. 395/400, 425, 395/427, 428, 429, 430, 405, 431, 492, 435; 365/230.03, 238.5, 205, 189.12, 184.04, 189.08, 203.03, 206, 230.06, 203.08; 327/57

[56] References Cited

U.S. PATENT DOCUMENTS

| | | | |
|---|---|---|---|
| 4,530,108 | 7/1985 | Wilmsmeyer | 377/111 |
| 4,630,195 | 12/1986 | Hester et al. | 395/375 |
| 4,879,685 | 11/1989 | Takemae | 365/189.11 |
| 5,093,783 | 3/1992 | Kitada | 395/400 |
| 5,177,706 | 1/1993 | Shinohara | 365/189.04 |
| 5,197,035 | 3/1993 | Ito | 365/230.05 |

OTHER PUBLICATIONS

*Introduction to VLSI System*, Chapter 5, pp. 189, 195.

Primary Examiner—Eddie P. Chan
Assistant Examiner—Hiep T. Nguyen
Attorney, Agent, or Firm—Townsend and Townsend and Crew

[57] ABSTRACT

To speed up data transfer of a plurality of registers between register banks in a microcomptuer having a register file formed by a built-in RAM and consisting of a plurality of register banks, the memory cells of the same type of registers belonging to different register banks are connected to the same bit lines. For data transfer of a plurality of registers between register banks, the word line 12 connecting a source register bank is first activated to output data to bit lines 13, and then the word line 12 connecting to a destination register bank is activated to read the data outputted to the bit lines 13, thus making it possible to speed up data transfer of a plurality of registers without the use of the internal data bus 3 of the microcomputer.

2 Claims, 10 Drawing Sheets

REGISTER FILE SYSTEM FOR MICROCOMPUTER INCLUDING A DECODING SYSTEM FOR CONCURRENTLY ACTIVATING SOURCE AND DESTINATION WORD LINES

This is a continuation of application Ser. No 07/964,221, filed Oct. 21, 1992, now abandoned.

BACKGROUND OF THE INVENTION

1. Field of the Invention

The present invention relates to a microcomputer having a register file formed by a built-in RAM and consisting of a plurality of register banks and, more particularly, to speeding up data transfer of a plurality of registers between register banks.

2. Description of the Prior Art

In most microcomputers having a large number of registers, a register file is formed by registers which are constituted by a RAM. In addition, the registers are divided into a plurality of groups (register banks) to store each state of the microcomputer so that high-speed context switching is made possible by shifting the register banks.

FIG.7 is a block diagram of the key parts of a conventional microcomputer comprising a register file formed by a plurality of register banks. In this example, the microcomputer comprises sixteen register banks, each consisting of eight 32-bit general-purpose registers, totalling 128 registers. In the figure, reference numeral 1 represents a register section in which registers are used to form a register file, 2 a control section for outputting to the register section 1 the register address of a register to be accessed and a signal for controlling the register section 1 so as to control the whole microcomputer, 3 an internal data bus as the passage of data between blocks in the microcomputer, 4 and 5 temporary registers disposed between an arithmetic logic section 6 and the internal bus 3, and 6 an arithmetic logic section for inputting data outputted to the internal data bus 3 through the temporary registers 4 and 5, executing various operations and outputting results to the internal data bus 3.

FIG. 8 is a block diagram of the internal configuration of the register section 1 shown in FIG. 7. In the figure, reference numerals 7(0)–7(31) represent an array of memory cells, 8 a decoder for decoding n number of high-order bits of a register address so as to activate one of the word lines 12(0)–12(31), 9 a decoder for decoding m number of low-order bits of a register address so as to activate one of the signal lines 11(0)–11(31), 10(0)–10(31) selectors for connecting to the internal data bus 3 pairs of bit lines 13(0)–13(31) corresponding to the activated signal line 11(0)–11(31), 11(0)–11(31) a signal line to which the result of decoding by the decoder 9 is outputted, 12(0)–12(31) lines to which the result of decoding by the decoder 8 is outputted, 13(0)–13(31) of bit lines consisting of bit and inverted bit signal lines and intersecting the word lines 12(0)–12(31), 14 a register address signal line to which n number of high-order bits of a register address are inputted, and 15 a register address signal line to which m number of low-order bits of a register address are inputted.

Here, n and m are integers larger than 0 which satisfy the equation $2^n \times 2^m = 128$, and are set properly by the hardware implementation method. The memory cell arrays 7 correspond to bits 0 to 31 of the 32-bit register from the left, and the memory cell array 7 corresponding to bit N is connected to an N-th data signal line of the internal data bus 3 through the respective selector 10. In other words, each register is formed by the memory cell arrays 7 corresponding to bits 0 to 31, and each register bank consists of eight registers per word line according to the value of n.

FIG.9 is a block diagram of the internal configuration of each memory cell array 7 shown in FIG. 8. In the figure, reference numeral 16 represents a memory cell disposed at a point of intersection between each word line 12 and each bit line 13 for storing one-bit information, and 17 a p-channel complementary metal oxide film semiconductor transistor (abbreviated as p-channel MOST hereinafter) for precharging each bit line 13.

FIG. 10 is a circuit diagram of each memory cell 16 shown in FIG. 9. In the figure, reference numeral 18 are n-channel MOSTs, and 19 inverters for storing one-bit information by being electrically disconnected from the bit line 13 by the n-channel MOST 18 and whose input and output are mutually connected.

Data read and write operations in the register section 1 of the prior art will be described in conjunction with FIGS. 7 to 10.

A data read operation will first be described. The p-channel MOSTs 17 of each memory cell array 7 are turned on for a certain period of time in response to a control signal inputted from the control section 2 so as to precharge all the bit lines 13. Thereafter, n number of high-order bits of a register address inputted from the control section 2 are inputted into the decoder 8, whereby one of the $2^n$ word lines 12 is activated. Then, the n-channel MOSTs 18 of all the memory cells 16 connected to the activated word line 12 are turned on, and data stored in the memory cells 16 appear on the bit lines 13. Meanwhile, m number of low-order bits of a register address inputted from the control section 2 are inputted into the decoder 9, whereby one of the $2^m$ signal lines 11 is activated. The bit lines 13 of the memory cell arrays 7 connected to the activated signal line are connected to the internal data bus 3 by the selector 10, and data is outputted to the internal data bus 3.

A data write operation will be described next. The p-channel MOSTs 17 of each memory cell array 7 are turned on for a certain period of time in response to a control signal inputted from the control section 2 so as to precharge all the bit lines 13. Thereafter, m number of low-order bits of a register address inputted from the control section 2 are inputted into the decoder 9, whereby one of the $2^m$ signal lines 11 is activated. The bit lines 13 of the memory cell arrays 7 connected to the activated signal line are connected to the internal data bus 3 so that data over the internal data bus 3 appears on the bit lines 13 selected by the selector 10. Meanwhile, n number of high-order bits of a register address inputted from the control section 2 are inputted into the decoder 8, whereby one of the $2^n$ word lines 12 is activated, and the n-channel MOSTs 18 of all the memory cells 16 connected to the activated word line 12 are turned on. Then, data over the bit lines 13 is written on the memory cells 16 connected to the bit lines 13 selected by the selector, and values stored in the memory cells 16 connected to the bit lines 13 not selected by the selector 10 remain unchanged.

Next, the operation of data transfer of a plurality of registers between register banks in the prior art will be described with reference to FIG. 7. The operation will be outlined hereafter. For data transfer between registers, the contents of a source register are read in the temporary register 4, and then are written on a destination register through the arithmetic logic section 6. This process is repeated as many times as the number of registers constituting one register bank (eight times in this case) to complete data transfer of a plurality of registers between register banks.

The i-th and j-th register banks are represented by Ri and Rj, and k-th registers belonging to i-th and j-th register banks are represented by Rik and Rjk (i, j=0–15, k=0–7), respectively. Take the case when data is transferred from the register bank Ri to the register bank Rj. When the register address of the register Rik and a control signal are inputted from the control section 2 to the register section 1, the register section 1 outputs the contents of the register Rik to the internal data bus 3 for storage in the temporary register 4. Thereafter, the contents of the temporary register 5 are cleared. Then, the arithmetic logic section 6 performs a logic sum operation on the temporary registers 4 and 5, and outputs the result of the operation to the register section 1 through the internal data bus 3. At the same time, the register address of the register Rjk and a control signal are also inputted into the register section 1 from the control section 2, and the result of the operation by the arithmetic logic section 6, that is, the contents of the register Rik, are written on the register Rjk. This operation is repeated eight times for register addresses Ri0 to Ri7 to be read and register addresses Rj0 to Rj7 to be written. This repetition completes data transfer from the register bank Ri to the register bank Rj.

Since the conventional microcomputer having a register file consisting of a plurality of register banks and formed by a built-in RAM is structured as described above, for data transfer of a plurality of registers between register banks, the operation of reading and transferring the contents of a source register to a temporary register and then writing them on a destination register needs to be repeated as many times as the number of registers constituting a register bank, thus taking a long time to transfer data.

SUMMARY OF THE INVENTION

The present invention has been worked out to solve the above problem, and it is therefore an object of the present invention to achieve a register file system for a microcomputer which can speed up data transfer of a plurality of registers between register banks.

To achieve the above target, the microcomputer of the present invention comprises a register file which is formed by a plurality of word lines, a plurality of bit lines and a plurality of memory cells disposed at points of intersections between the word lines and the bit lines, has a plurality of registers each constituted by a predetermined number of memory cells connected to each word line and divided into a plurality of register banks. For data transfer of a plurality of registers between register banks, the memory cells of the same type of registers belonging to different register banks are connected to the same bit lines, and the microcomputer further comprises a word line selection circuit for activating one of the word lines connecting a register bank to be read, and at the same time, activating one of the word lines connecting a register bank to be written while keeping active the former word line so as to transfer data from a memory cell to another memory cell over the same bit lines.

In other words, in the present invention, for data transfer of a plurality of registers between register banks, a word line connecting a source register bank is first activated to output data thereof to the bit lines, and then, a word line connecting a destination register bank is activated to read the data outputted to the bit lines, whereby data transfer of a plurality of registers between register banks is performed at a high speed without using the internal data bus.

The above and other objects, features and advantages of the invention will become more apparent from the following description when taken into conjunction with the accompanying drawings.

DESCRIPTION OF THE PREFERRED EMBODIMENT

Embodiment 1

Figure 7:
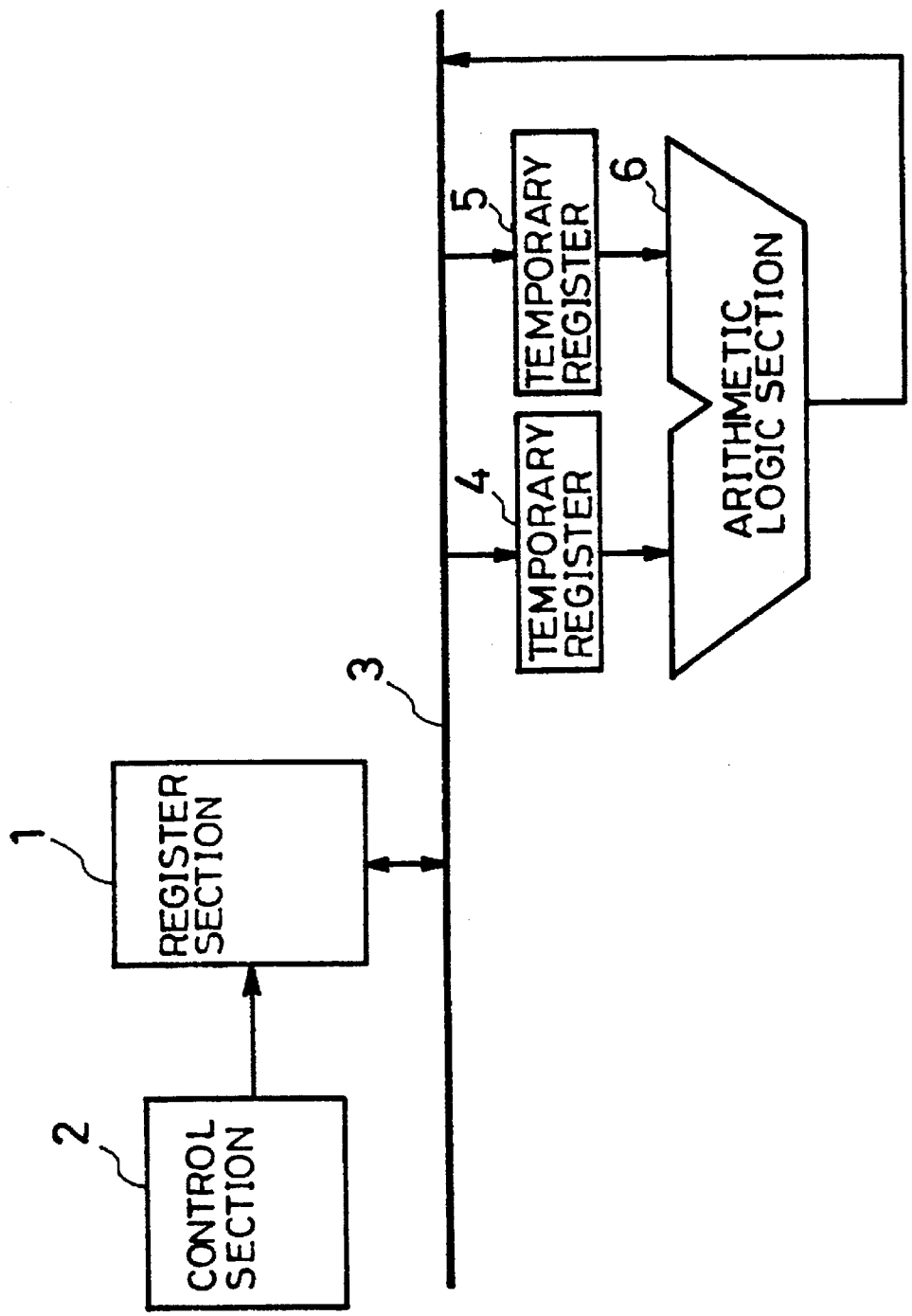
FIG. 7 is a block diagram of the key parts of a microcomputer having a register file formed by a plurality of register banks.

A block diagram of the key parts of a microcomputer according to the first embodiment of the present invention is the same as FIG. 7 of the prior art. Like the prior art, the microcomputer of this embodiment comprises sixteen register banks each consisting of eight 32-bit general purpose registers, totalling 128 registers.

Figure 1:
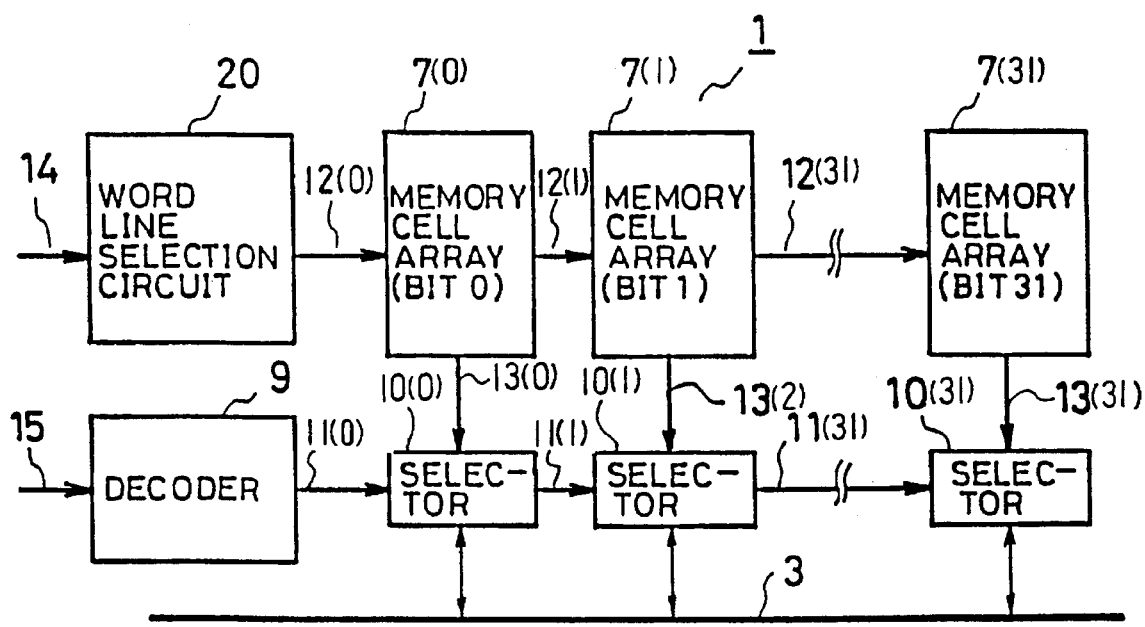
FIG. 1 is a block diagram of the internal configuration of the register section of a microcomputer according to an embodiment of the present invention.
Figure 8:
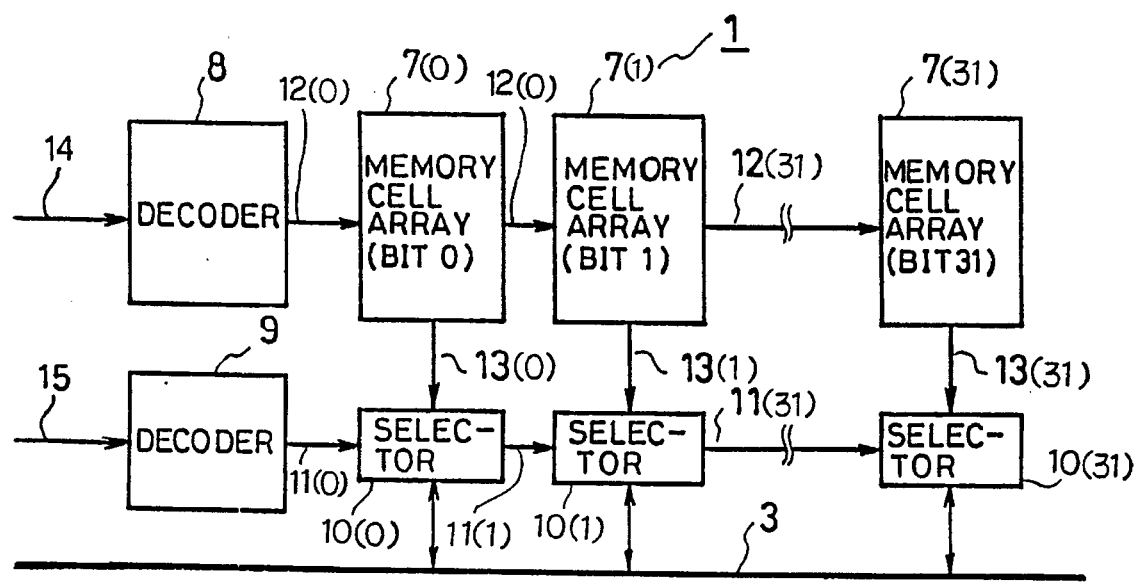
FIG. 8 is a block diagram of the internal configuration of the register section of a prior art microcomputer.

FIG. 1 is a block diagram of the internal configuration of the register section 1 of the microcomputer according to the first embodiment of the present invention. In the figure, reference numeral 20 represents a word line selection circuit for inputting four high-order bits of the register addresses of source registers and then four high-order bits of the register addresses of destination registers and for activating the word line 12 connecting the source registers and at the same time activating the word line 12 connecting the destination registers while keeping active the former word line. Other reference numerals represent the same components as FIG. 8.

Figure 2:
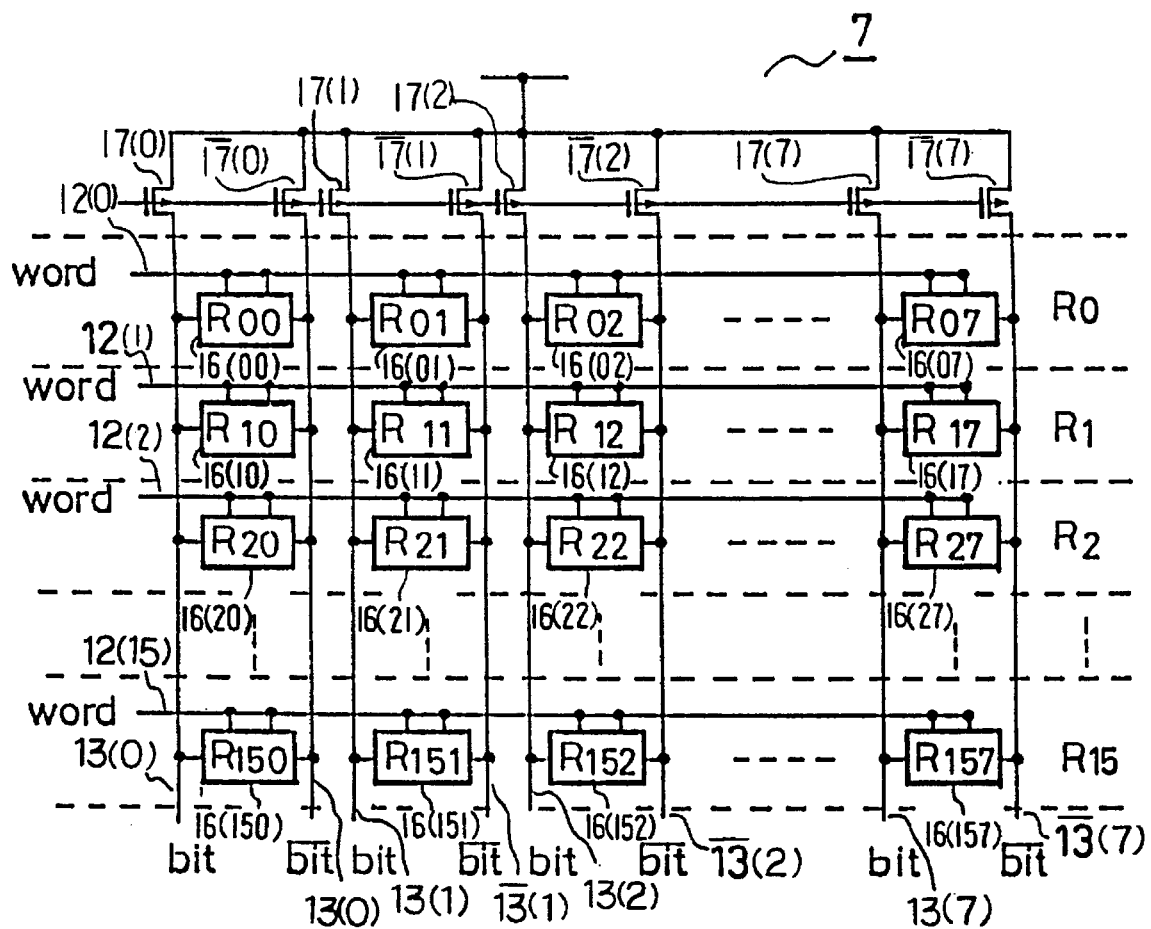
FIG. 2 is a block diagram of the internal configuration of each memory cell array of a microcomputer according to the first embodiment of the present invention.
Figure 9:
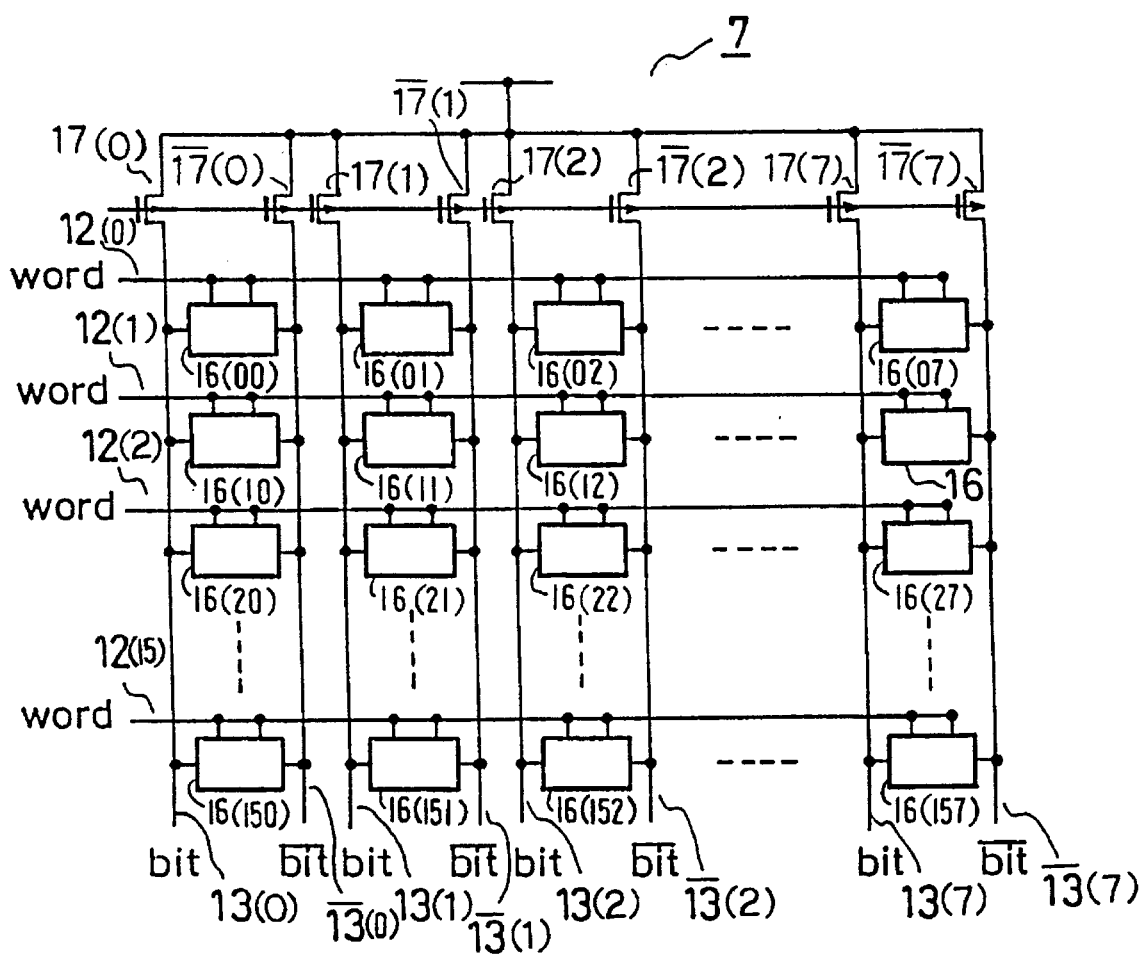
FIG. 9 is block diagram of the internal configuration of each memory cell array of the prior art microcomputer.

FIG. 2 is a block diagram of the internal configuration of each memory cell array 7 shown in FIG. 1. In the figure, reference numerals represent the same components as FIG. 9, but in the present invention, the memory cells 16 of the same type of registers belonging to different register banks are connected to the same bit lines 13. In other words, as for arbitrary k (k=0–7), the memory cells 16 of registers Rik (i=0–15) are all connected to the same bit lines 13. For this connection, sixteen memory cells of each memory cell array 7 are connected to the same bit lines 13, and eight memory cells 16 are connected to the same word line 12. Therefore, the registers Rik belonging to the same register bank Ri are all connected to the same word line 12.

Figure 10:
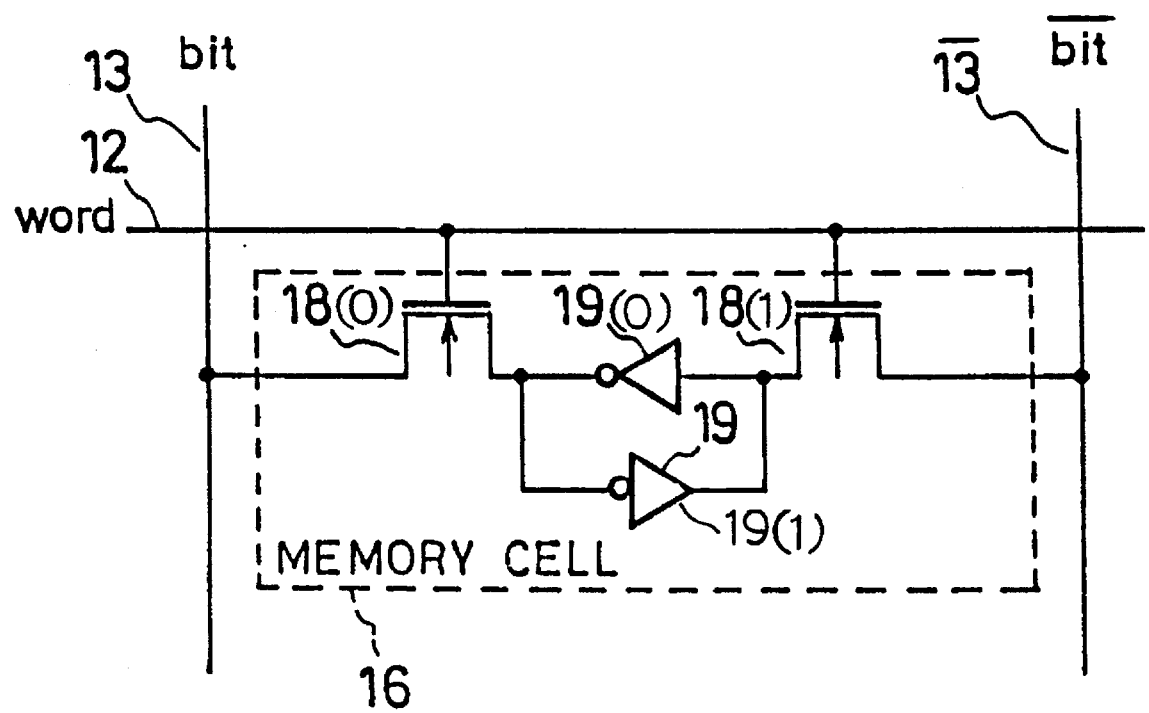
FIG. 10 is a circuit diagram of the internal configuration of each memory cell.

The circuit diagram of each memory cell 16 shown in FIG. 2 is the same as FIG. 10 of the prior art.

Then, data read and write operations in the register section 1 of the first embodiment of the present invention will be described with reference to FIG. 1, FIG. 2 and FIG. 10.

Data is read and written simultaneously with a single operation. The p-channel MOSTs 17 of each memory cell array 7 are turned on for a certain period of time by a control signal inputted from the control section 2 so as to precharge all the bit lines 13. Thereafter, four high-order bits of the register addresses of the source registers inputted from the control section 2 are inputted into the word selection circuit 20 to activate one of the sixteen word lines 12. Then, the n-channel MOSTs 18 of all memory cells 16 connected to the activated word line 12 are turned on, and data stored in the memory cells 16 are outputted to the bit lines 13. In this state, the word line selection circuit 20 further activates one of the sixteen word lines 12 according to the result of decoding the four high-order bits of the register addresses of the destination registers inputted from the control section 2, and the n-channel MOSTs 18 of all the memory cells 16 connected to the activated word line 12 are turned on. As a result, the values outputted to the bit lines 13 are written on the memory cells of the destination registers whose n-channel MOSTs 18 are turned on later. This write operation is performed on all of the bit lines 13 simultaneously. Since all the registers belonging to the same register bank are connected to the same word line 12, transfer of data in a plurality of registers between register banks is accomplished by one time of the above operation.

The operation of data transfer of a plurality of registers between register banks in the first embodiment of the present invention will be described with reference to FIG. 7.

Take the case when data is transferred from the register bank Ri to the register bank Rj. The register addresses of registers belonging to the register bank Ri, the register addresses of registers belonging to the register bank Rj and a control signal are inputted from the control section 2 to the register section 1. In the register section 1, data stored in all the registers of the register bank Ri are transferred to the respective registers of the register bank Rj by one time of the above-mentioned operation. Since the above-mentioned operation is performed inside the register section 1, the internal data bus 3 is not used.

Embodiment 2

A block diagram of the key parts of a microcomputer according to the second embodiment of the present invention is the same as FIG. 7 of the prior art. Like the prior art, the microcomputer of this embodiment comprises sixteen register banks each consisting of eight 32-bit general-purpose registers, totalling 128 registers.

A block diagram of the internal configuration of the register section 1 of the microcomputer according to the second embodiment of the present invention is the same as FIG. 1.

Figure 3:
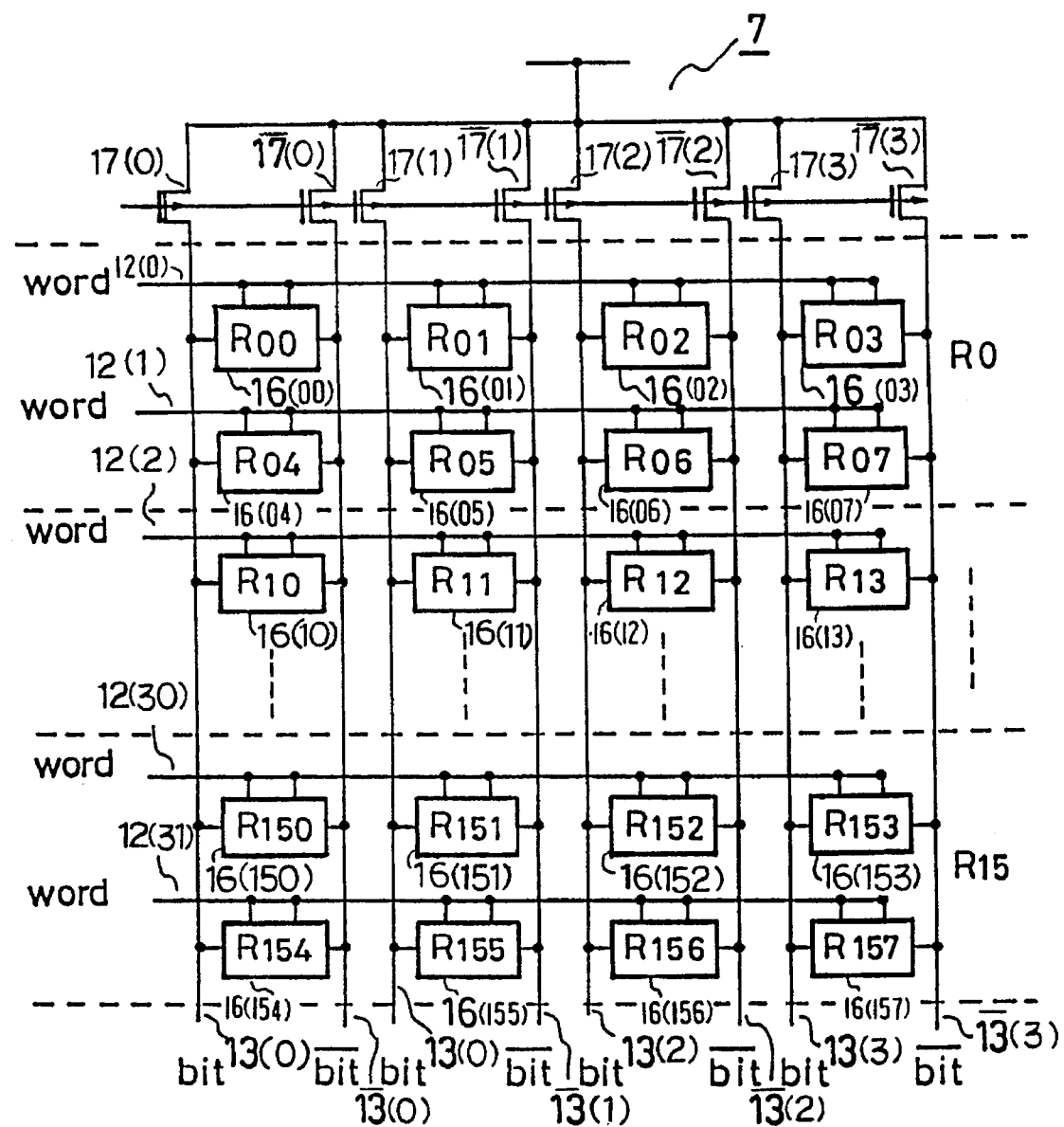
FIG. 3 is a block diagram of the internal configuration of each memory cell array of a microcomputer according to the second embodiment of the present invention.

FIG. 3 is a block diagram of the internal configuration of each memory cell array 7 shown in FIG. 1. In the figure, reference numerals represent the same components as FIG. 9, but as in the first embodiment, the memory cells 16 of the same type of registers belonging to different register banks are connected to the same bit lines 13. In other words, as for arbitrary k (k=0–7) all the memory cells 16 of the registers Rik (i=0–15) are connected to the same bit lines 13. For this connection, in this embodiment, thirty-two memory cell arrays 7 are connected to the same bit lines 13, and four memory cells 16 to the same word line 12. Therefore, the registers Rik belonging to the same register bank Ri are connected by halves to two adjacent word lines 12.

A circuit diagram of the internal configuration of each memory cell 16 shown in FIG. 3 is the same as FIG. 10 of the prior art.

Data write and read operations in the register section 1 of the second embodiment of the present invention will be described with reference to FIG. 1, FIG. 3 and FIG. 10.

Data is read and written simultaneously. Take the case when data stored in the register bank Ri is transferred to the register bank Rj. The p-channel MOSTs 17 of each memory cell array 7 are turned on for a certain period of time by a control signal inputted from the control section 2 so as to precharge all the bit lines 13. Thereafter, five high-order bits of the register addresses of registers Ri0 to Ri3 inputted from the control section 2 are inputted into the word line selection circuit 20 to activate one of the thirty-two word lines 12. Then, the n-channel MOSTs 18 of all the memory cells 16 connected to the activated word line 12 are turned on, and data stored in the memory cells appear on the bit lines 13. In this state, the word line selection circuit 20 further activates one of the thirty-two word lines 12 according to the result of decoding the five high-order bits of the register addresses of registers Rj0 to Rj3 inputted from the control section 2, and the n-channel MOSTs 18 of all the memory cells 16 connected to the activated word line 12 are turned on. As a result, values outputted to the bit lines 13 are written on the memory cells 16 of the registers Rj0 to Rj3 whose n-channel MOSTs 18 are turned on later. This write operation is performed on all the bit lines 13 simultaneously. Data transfer from the registers Ri0–Ri3 to the registers Rj0–Rj3 is accomplished by the above-mentioned operation. Afterwards, data transfer from the registers Ri4–Rj7 to the registers Rj4–Rj7 is performed by the same operation as described above to accomplish data transfer of a plurality of registers between register banks.

The operation of data transfer of a plurality of registers between register banks in FIG. 7 of the second embodiment of the present invention is the same as the first embodiment of the invention except that the above-mentioned operation is performed twice.

When data transfer is finished by only one time of the above-mentioned operation, data transfer of only half of the registers of a register bank is possible.

The layout of memory cells and the internal configuration and operation of the word line selection circuit 20 which is also the feature of the present invention will be described in detail taking the first embodiment as an example. The second embodiment is the same as the first embodiment except that the number of high-order bits of inputted register addresses is five instead of four, the number of word lines 12 to which the result of decoding is outputted is thirty-two instead of sixteen, and the data transfer operation is performed twice.

Figure 4:
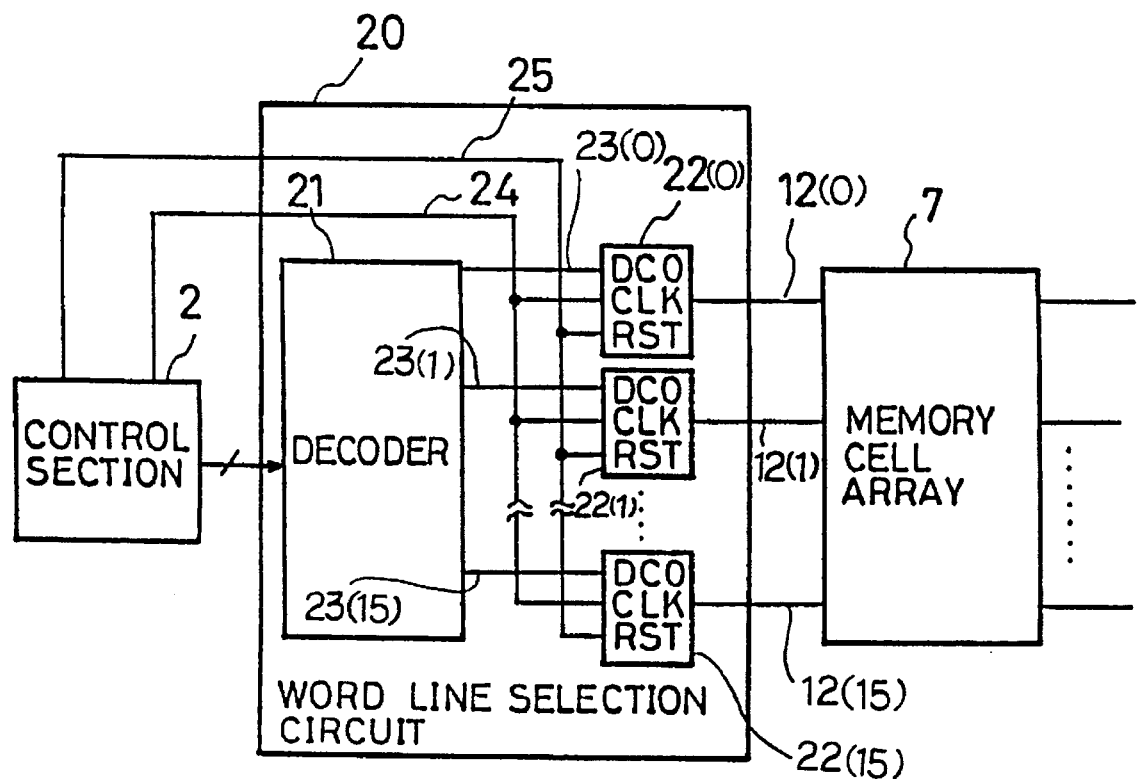
FIG. 4 is a block diagram of the internal configuration of the word line selection circuit shown in FIG. 1.

FIG. 4 is a block diagram of the internal configuration of the word line selection circuit 20 shown in FIG. 1. In the figure, reference numeral 21 is a decoder for decoding the four high-order bits of register addresses and activating one of the decoder output signals 23 corresponding to the respective word lines 12, which is the same as the decoder 8 shown in FIG. 8. Numeral 22 is word signal holding circuits for holding each output of the decoder 21 and outputting it to the corresponding word line 12, 23 decoder output signal lines, 24 a clock signal line and 25 a reset signal line.

Figure 5:
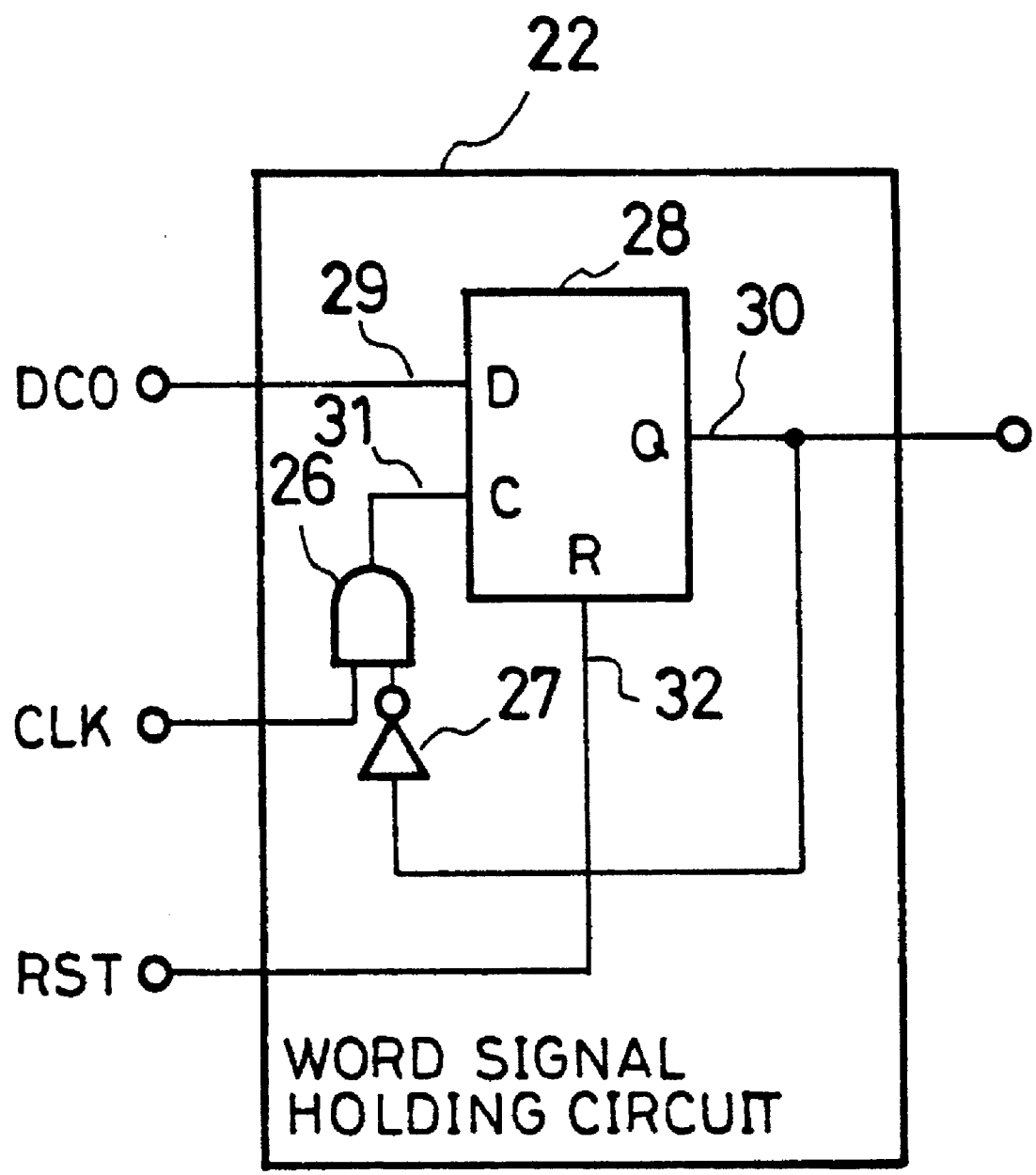
FIG. 5 is a circuit diagram of the internal configuration of each word signal holding circuit shown in FIG. 4.

FIG. 5 is a circuit diagram of the internal configuration of each word signal holding circuit 22 shown in FIG. 4. In the figure, reference numeral 26 is an AND gate, 27 an inverter gate, 28 a flip-flop for outputting a decoder output signal inputted into a data input terminal 29 to a data output terminal 30 when a rise in signal inputted into a clock terminal 31 is detected, and for outputting '0' to the data output terminal 30 when a rise in signal inputted into a reset terminal 32 is detected, 29 the data input terminal, 30 the data output terminal, 31 the clock terminal, and 32 the reset terminal of the flip-flop 28.

Figure 6:
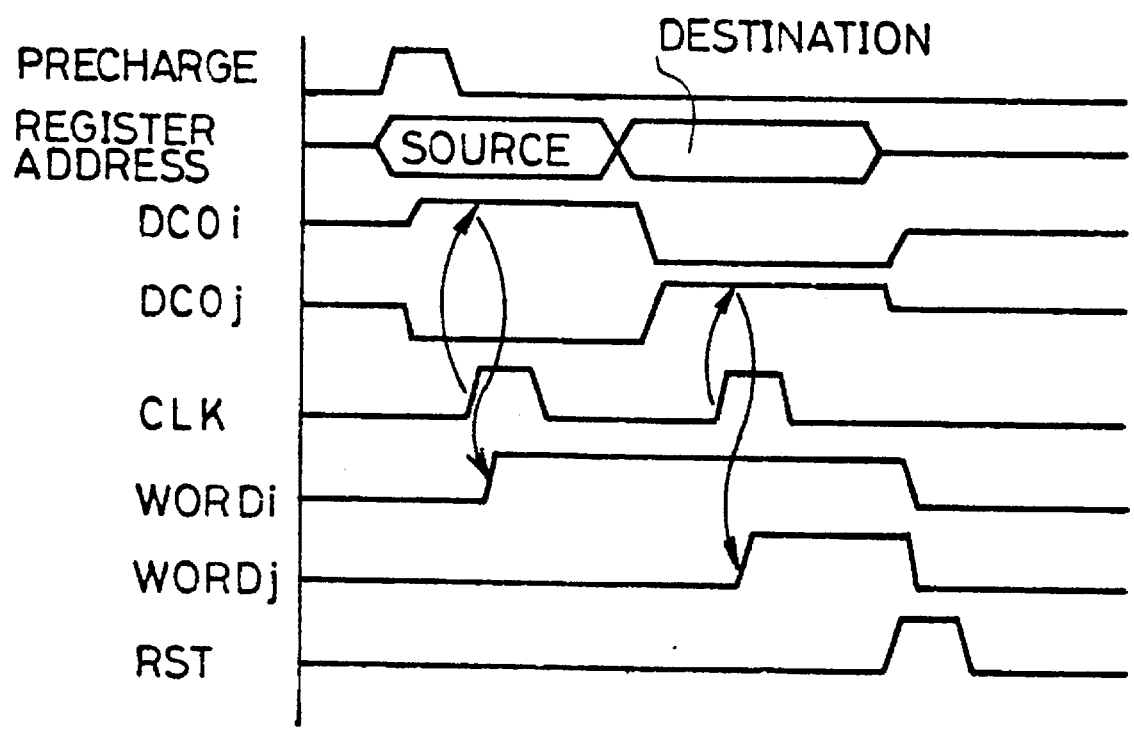
FIG. 6 is a timing chart for data transfer between register banks.

FIG. 6 is a timing chart for data transfer between register banks.

The above operation will be described hereafter with reference to FIGS. 4 to 6 and FIG. 10.

As described above, according to the control signal inputted from the control section 2, the p-channel MOSTs 17 of each memory cell array 7 are turned on for a certain period of time so as to precharge all the bit lines 13. The four high-order bits of the register addresses of source registers inputted from the control section 2 are inputted into the word line selection circuit 20, and the decoder 21 decodes the register addresses so that one (DCOi) of the sixteen decoder output signal lines 23 is activated. The flip-flops 28 of all the word signal holding circuits 22 output '0' at the start of operation. The control section 2 outputs a pulse to the clock signal line 24 when the output of the decoder 21 becomes definite. Since the flip-flop 28 outputs '0', the flip-flop 28 detects a rise in the clock pulse through the AND gate 26 and outputs the signal inputted from the decoder 21 to the word line 12. At this time, only a single word line WORDi12 selected by the four high-order bits of the register addresses of the source registers is activated. The n-channel MOSTs 18 of all the memory cells 16 connected to the activated word line WORDi12 are turned on, and data stored in the memory cells 16 are read and appear on the bit lines 13.

Thereafter, the four high-order bits of the register addresses of destination registers inputted from the control section 2 are inputted into the word line selection circuit 20, and the decoder 21 decodes the register addresses so that one (DCOj) of the sixteen decoder output signal lines 23 is activated. The control section 2 outputs a pulse to the clock signal line 24 when the output of the decoder 21 becomes definite. At this time, flip-flops 28 which output '0' detect a rise in clock pulse and output the signal inputted from the decoder 21 to the word lines 12, but the other flip-flops which output '1' continue to output '1' since a clock pulse is not inputted from the clock signal line 24 by the AND gate 26. In other words, the word line WORDi12 is kept active. At this time, only two word lines WORDi and WORDj selected by the four high-order bits of the register addresses of source and destination registers become active concurrently. The n-channel MOSTs 18 of all the memory cells 16 connected to the word line WORDj12, which becomes active later are turned on, whereby the n-channel MOSTs 18 of all the memory cells connected to the word lines WORDi and WORDj are turned on. As a result, values outputted to the bit lines 13 are written on the memory cells 16 of the destination registers whose n-channel MOSTs 18 are turned on later. Upon the completion of data transfer in the memory cell arrays 7, the control section 2 activates the reset signal 25, all the flip-flops 28 output '0', and all the word lines become '0'.

As described in the foregoing, this write operation is performed on all the bit lines 13 simultaneously. Since registers belonging to the same register bank are connected to the same word lines 12, once the above operation is performed, data transfer of a plurality of registers between register banks is completed.

Since the present invention is structured as described above, and data is transferred directly between the memory cells connected to the same bit lines in the register file, data transfer of a plurality of registers between register banks can be performed much faster than the prior art. In addition, since the internal data bus of the microcomputer is not used during this transfer operation, other resources within the microcomputer are able to use the internal data bus, thus making possible parallel processing and improving the total performance of the microcomputer.

What is claimed is:

1. A register file system for a microcomputer comprising:

a control section for outputting a clock signal (CLK) when data is to be read from or written to the register file system and for outputting a reset signal (RST) at the termination of a register transfer operation;

a plurality of word lines;

a decoder for outputting an address signal (DCO) to select a word line specified by a received register bank address;

a plurality of bit lines arranged to intersect each of the plurality of word lines;

a plurality of memory cells disposed at intersections between the word lines and bit lines;

a plurality of register banks, each register bank including a plurality of memory cells coupled to a corresponding one of said word lines and including a plurality of registers, with each register composed of a predetermined number of memory cells which function as ordered bit positions of a register, and with the same bit position of corresponding registers in each register bank coupled to an associated bit line;

word signal holding circuits, each word signal holding circuit coupled to a corresponding word line, for activating a source word line corresponding to a register bank to be read selected by a source address signal (DCO) from the decoder and at the same time activating a destination word line corresponding to a register bank to be written selected by a destination address signal (DCO) from the decoder while keeping the source word line active to transfer data between registers in different register banks;

with each word signal holding circuit including:

a flip-flop which is responsive to an address signal (DCO) in synchronism with the clock signal (CLK), received at a clock input terminal, and having an output being an active state signal if the corresponding word line is selected and which is also responsive to the reset signal (RST) to change the active state signal to non-active state signal at the completion of the register transfer operation, an inverter gate for receiving and inverting an output signal of the flip-flop, and an AND gate responsive to the output signal of the inverter gate and clock signal (CLK) for supplying the logic sum of these signals to the clock input of the flip-flop to prevent the flip-flop activating the source word line from changing its output when a clock signal (CLK) is output to cause a different flip-flop to activate the destination word line.

2. A register file system for a microcomputer comprising:

a memory cell array composed of a plurality of memory cells connected between intersections of word lines and bit lines, said memory cell array divided into plurality of register banks, each including a like number of registers formed of a predetermined number of memory cells connected to each of the word lines; and word signal holding circuits, coupled to said word lines, for activating a word line corresponding to a register bank to be read and at the same time activating a word line corresponding to a register bank to be written to transfer data between registers in different register banks, and each of the word signal holding circuits comprises a change signal means, having an output coupled to a corresponding word line in said plurality of word lines, which is responsive to an address signal (DCO) to output an active state signal and which is also responsive to a reset signal (RST) to change the active state signal to a non-active state signal, a first gate for receiving and inverting the active state signal or non-active state signal output by the change signal means to generate an output signal, and a second gate responsive to the output signal of the first gate and a clock signal for supplying the logic sum of these signals to a clock input terminal of the change signal means.

* * * * *